(12) United States Patent
Senda et al.

(10) Patent No.: US 7,591,911 B2
(45) Date of Patent: Sep. 22, 2009

(54) PLATED FILM OF GOLD-COBALT AMORPHOUS ALLOY, ELECTROPLATING BATH, AND METHOD FOR ELECTROPLATING

(75) Inventors: Kazutaka Senda, Soka (JP); Masaru Kato, Soka (JP); Tetsuya Osaka, Tokyo (JP); Yutaka Okinaka, Tokyo (JP)

(73) Assignees: Kanto Kagaku Kabushiki Kaisha, Tokyo (JP); Waseda University, Tokyo (JP)

( * ) Notice: Subject to any disclaimer, the term of this patent is extended or adjusted under 35 U.S.C. 154(b) by 178 days.

(21) Appl. No.: 11/529,537

(22) Filed: Sep. 29, 2006

(65) Prior Publication Data

US 2007/0095440 A1 May 3, 2007

(30) Foreign Application Priority Data

Sep. 30, 2005 (JP) ............... 2005-286759

(51) Int. Cl.
*C22C 45/00* (2006.01)
(52) U.S. Cl. .............. 148/403; 420/435; 420/512
(58) Field of Classification Search ............ None
See application file for complete search history.

(56) References Cited

U.S. PATENT DOCUMENTS

| | | | | |
|---|---|---|---|---|
| 4,748,592 | A * | 5/1988 | Nagao et al. ......... | 365/113 |
| 6,818,119 | B2 * | 11/2004 | Wang et al. ......... | 205/560 |
| 2006/0072187 | A1 * | 4/2006 | McKinnell et al. ...... | 359/321 |

FOREIGN PATENT DOCUMENTS

| | | | |
|---|---|---|---|
| JP | 48-000319 A | * | 1/1973 |
| JP | 60033382 A | | 2/1985 |
| JP | 62-290893 A | | 12/1987 |

OTHER PUBLICATIONS

IBM Technical Disclosure Bulletin NN6509634, "Amorphous Ferromagnetic Alloys", Sep. 1965, vol. 8, No. 4.*
Watanabe, T., Fine Plating, Structure Control Technology for Plated Layer and Analytic Method Thereof, pp. 256-262, 2002.
Kawai, S., Studies on Structures of Au-Ni Electrodeposited alloys, vol. 19, No. 12, pp. 487-491, 1968.
Shimizu, et al., Electronmicroscopic Investigation on the Microstructure and Phase of Electrodeposited Au-Ni Alloys, vol. 27, No. 1, pp. 20-24, 1976.
Omi, et al., W-Enrichment of Electroplated Ni-W Alloy Films and Film Properties, vol. 39, No. 12, pp. 809-812, 1988.
Watanabe, T., Formation Mechanism of Amorphous Alloys by Plating Method, vol. 40, No. 3, pp. 21-25, 1989.
Baba, N., Electro- and/or Chemical Deposition of Amorphous Oxide Films and Their Applications, vol. 40, No. 3, p. 27, 1989.

* cited by examiner

*Primary Examiner*—George Wyszomierski
(74) *Attorney, Agent, or Firm*—Birch, Stewart, Kolasch & Birch, LLP

(57) ABSTRACT

A gold-cobalt based amorphous alloy plated film consisting of a homogeneous amorphous phase not having microcrystals is formed by electroplating conducted by use of an electroplating bath containing a gold cyanide salt in a concentration of 0.01 to 0.1 mol/dm$^3$ in terms of gold, a cobalt salt in a concentration of 0.02 to 0.2 mol/dm$^3$ in terms of cobalt, and a tungstate in a concentration of 0.1 to 0.5 mol/dm$^3$ in terms of tungsten. The gold-cobalt based amorphous alloy plated film obtained consists of a homogeneous amorphous phase not having microcrystals, and has an enhanced hardness while retaining the good contact resistance and chemical stability intrinsic of gold on such levels as to be free of problems on a practical use basis; therefore, the gold-cobalt based amorphous alloy plated film is effective for use as a contact material in electric and electronic component parts such as relays.

5 Claims, 1 Drawing Sheet

PLATED FILM OF GOLD-COBALT AMORPHOUS ALLOY, ELECTROPLATING BATH, AND METHOD FOR ELECTROPLATING

BACKGROUND OF THE INVENTION

1. Field of the Invention

The present invention relates to a gold-cobalt based amorphous alloy plated film useful as a plated film for terminals of component parts of electric apparatuses and excellent in electrical and mechanical properties, an electroplating bath capable of being used to form the gold-cobalt based amorphous alloy plated film, and an electroplating method conducted by use of the electroplating bath.

2. Prior Art

At present, gold plated films called the hard gold plated film are widely used as an electric contact material in electric and electronic component parts such as connectors, small-sized relays, printed wiring boards, etc., particularly at portions required of high reliability. The hard gold plated film contains cobalt, nickel or the like added to gold so as to enhance the hardness of the plated film without lowering the good conductivity and chemical stability which are intrinsic of gold. The hard gold plated film has a microstructure in which microcrystals (20 to 30 nm) of gold are bound, and the microstructure is considered to provide the hardness (in terms of Knoop hardness Hk, about 170) which is needed at minimum for obtaining the wear resistance required of contact material.

On the other hand, attendant on the reduction in size of electronic component parts in recent years, the size of the electric contacts has also been reduced, and the plated films formed on such micro contacts have also been reduced in size and film thickness. Therefore, there is a request for a further enhancement of the hardness of the plated films in order to attain a higher wear resistance.

In addition, it is considered that the size of contacts will approach the size of microcrystals in the above-mentioned hard gold plated film in the near future. In the case where the hard gold plated film is formed on such a micro contact, the absolute number of the microcrystals constituting the plated film will be small. In such a case, therefore, it is expected to be impossible to attain the same level of durability as in the case of forming the hard gold plated film on a contact having the size which is applied at present.

SUMMARY OF THE INVENTION

The present invention has been made in consideration of the above-mentioned circumstances. Accordingly, it is an object of the present invention to provide a gold-cobalt based amorphous alloy plated film excellent in wear resistance and enhanced in hardness while having good conductivity and chemical stability, an electroplating bath capable of being used to form the gold-cobalt based amorphous alloy plated film, and an electroplating method conducted by use of the electroplating bath.

The present inventor has made intensive and extensive investigations in order to attain the above object. As a result of the investigations, it has been found out that when electroplating is conducted by use of an electroplating bath containing a gold cyanide salt, a cobalt salt and a tungstate in predetermined concentrations and preferably further containing a complexing agent such as an organic acid, a salt thereof, etc., a gold-cobalt based amorphous alloy plated film consisting of a homogeneous amorphous phase not having microcrystals is obtained, and the plated film has an enhanced hardness while maintaining the good contact resistance and chemical stability intrinsic of gold at such levels as to be free of problems on a practical use basis. Based on the finding, the present invention has been completed.

Accordingly, according to a first aspect of the present invention, there is provided a gold-cobalt based amorphous alloy plated film consisting of a homogeneous amorphous phase not having microcrystals. According to a second aspect of the present invention, there is provided an electroplating bath containing a gold cyanide salt in a concentration of 0.01 to 0.1 mol/dm$^3$ in terms of gold, a cobalt salt in a concentration of 0.02 to 0.2 mol/dm$^3$ in terms of cobalt, and a tungstate in a concentration of 0.1 to 0.5 mol/dm$^3$ in terms of tungsten. Further, according to a third aspect of the present invention, there is provided an electroplating method wherein a gold-cobalt based amorphous alloy plated film is formed on a work by use of an electroplating bath according to the second aspect of the invention.

The gold-cobalt based amorphous alloy plated film in the present invention consisting of a homogeneous amorphous phase not having microcrystals, has an enhanced hardness while maintaining the good contact resistance and chemical stability intrinsic of gold at such levels as to be free of problems on a practical use basis, and is therefore useful as a contact material for electric and electronic component parts such as relays.

DESCRIPTION OF THE PREFERRED EMBODIMENTS

Figure 1:
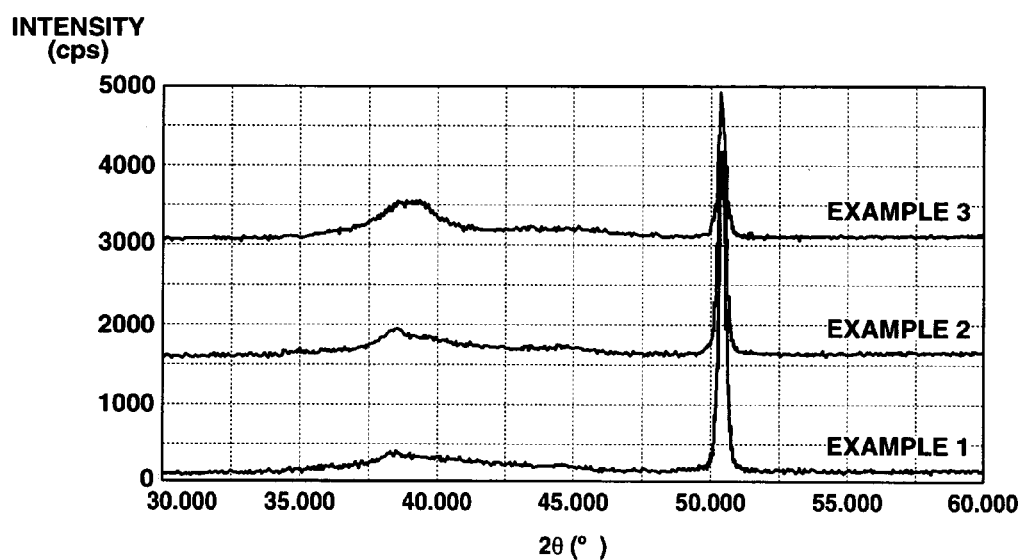
FIG. 1 is diagram showing the XRD patterns of gold-cobalt based amorphous alloy plated films obtained in Examples 1 to 3.

Now, the present invention will be described more in detail below.

The gold-cobalt based amorphous alloy plated film in the present invention consists of a homogeneous amorphous phase not having microcrystals.

A contact material for electric and electronic component parts must be low in electric resistance between contacts in contact with each other, and must have chemical stability such as the property of not being denatured in the use environments of the contact material. From this point of view, a gold plated film is effective. On the other hand, as a microstructure of a plated film which is not lowered in hardness even on the above-mentioned micro contacts, rather an amorphous phase structure is ideal than a crystalline structure.

The gold-cobalt based amorphous alloy plated film in the present invention contains gold and cobalt, and its microstructure is a homogeneous amorphous phase structure not having microcrystals. Due to these characteristic features, not only good contact resistance and chemical stability but also such a high hardness as not to be obtained with conventional gold or gold alloy plated films can be attained. Such an amorphous phase structure not having microcrystals can be confirmed by X-ray diffraction (XRD) pattern, transmission electron microscopic (TEM) image, and transmission high-energy electron beam diffraction (THEED) image.

It is preferable that the gold-cobalt based amorphous alloy plated film in the present invention contains gold and cobalt as metallic components, and the content of the metallic components is not less than 96 wt %, preferably not less than 96.5 wt %, more preferably not less than 97 wt %, further preferably not less than 97.5 wt %, and particularly preferably 98 wt %. When the content of the metallic components is not less than 96 wt %, sufficient electrical properties are obtained favorably. Besides, it is preferable that the composition of gold and cobalt in the metallic components, in terms of the total amount of gold and cobalt, is not less than 98 wt %, particularly not less than 99 wt %, and further not less than 99.5 wt %, and that the ratio of gold to cobalt (gold/cobalt (weight ratio)) is not less than 0.5, preferably not less than 1.0, more preferably not less than 2.0 and not more than 10.0, preferably not more than 9.0, and more preferably not more than 8.0, since both the conductivity as well as chemical stability and the hardness of the gold-cobalt based amorphous alloy plate film can be obtained in good balance. The gold-cobalt based amorphous alloy plated film in the present invention has a sufficient chemical stability even where the gold content is comparatively low; therefore, it is possible to reduce the amount of expensive gold used and thereby to suppress the cost of the component part as the plated work to a low level.

Besides, it is preferable that the gold-cobalt based amorphous alloy plated film in the present invention contains carbon, in addition to the metallic components, in a content of not more than 4 wt %, preferably not more than 3.5 wt %, more preferably not more than 3 wt %, and further preferably not more than 2 wt %.

The gold-cobalt based amorphous alloy plated film in the present invention can be formed by electroplating conducted by use of an electroplating bath which contains a gold cyanide salt, a cobalt salt and a tungstate.

The electroplating bath thus contains a gold cyanide salt, a cobalt salt and a tungstate. Examples of the gold cyanide salt include potassium gold cyanide, sodium gold cyanide, lithium gold cyanide, etc. Examples of the cobalt salt include cobalt sulfate, cobalt nitrate, etc. Examples of the tungstate include sodium tungstate, potassium tungstate, etc. In the plating bath, the concentration of the gold cyanide salt in terms of gold is 0.01 to 0.1 mol/dm$^3$, preferably 0.015 to 0.04 mol/dm$^3$, and more preferably 0.02 to 0.035 mol/dm$^3$, the concentration of the cobalt salt in terms of cobalt is 0.02 to 0.2 mol/dm$^3$, preferably 0.05 to 0.1 mol/dm$^3$, and more preferably 0.07 to 0.08 mol/dm$^3$, and the concentration of the tungstate in terms of tungsten is 0.1 to 0.5 mol/dm$^3$, preferably 0.15 to 0.25 mol/dm$^3$, and more preferably 0.17 to 0.19 mol/dm$^3$.

In addition, preferably, the electroplating bath further contains a complexing agent. Examples of the complexing agent include organic acids or salts thereof having a complexing action and a pH buffer action. Examples of the organic acids and salts thereof include citric acid, tartaric acid, malic acid and their sodium salts, potassium salts, ammonium salts, etc. It is preferable that the concentration of the complexing agent in the plating bath is 0.1 to 0.5 mol/dm$^3$, particularly 0.17 to 0.34 mol/dm$^3$, and more particularly 0.24 to 0.27 mol/dm$^3$.

It is preferable that the electroplating bath is neutral or acidic, particularly weakly acidic, and that the pH of the bath is not less than 5, preferably not less than 6 and is not more than 10, preferably not more than 9. The pH can be regulated by use of a conventionally known pH regulator such as $NH_3$ and sulfuric acid.

The electroplating conditions are not particularly limited; preferably, the plating temperature is 50 to 80° C., particularly 65 to 75° C. It is preferable that the current density is not less than 2 mA/cm$^2$, preferably not less than 5 mA/cm$^2$, more preferably not less than 10 mA/cm$^2$, and is not more than 200 mA/cm$^2$, preferably not more than 150 mA/cm$^2$, more preferably not more than 100 mA/cm$^2$. Besides, an insoluble anode such as platinum can be used as an anode. In addition, cobalt may also be used as the anode. On the other hand, examples of the work (the body to be plated) include metallic materials such as copper used for electric wiring. The metallic material may be a substrate layer formed on a metallic or nonmetallic base member. Agitation may or may not be conducted. However, plating under agitation is preferable. The current may be applied as a pulsed current.

The gold-cobalt based amorphous alloy plated film formed by electroplating carried out using the electroplating bath as above contains gold and cobalt as the metallic components, and may in some cases further contain tungsten as the metallic component. In this case, the content of tungsten is comparatively low, notwithstanding a considerable amount of tungsten (tungstate) is contained in the electroplating bath. The content of tungsten in the metallic components may be, for example, not more than 2 wt %, particularly not more than 1 wt %, and further not more than 0.5 wt %. Besides, tungsten may be present substantially in a trace amount in some cases, or, further, tungsten may not be detectable by the analyzing technique generally used for composition analysis of plated films.

Therefore, according to this electroplating method, the composition of the components in the electroplating bath and the electroplating conditions are appropriately selected, whereby both amorphous alloy plated films containing gold, cobalt and tungsten in detectable contents, i.e., gold-cobalt-tungsten amorphous alloy plated films, and gold-cobalt based amorphous alloy plated films in which tungsten is not detected can be formed. The gold-cobalt based amorphous alloy plated films in which tungsten is not detected include those containing tungsten in an amount which is not less than the impurity-level amount but which is too small to be detected by the analytic technology generally used for composition analysis of plated films.

Particularly, it is preferable that the gold-cobalt-tungsten amorphous alloy plated film containing gold, cobalt and tungsten is such that the metallic components contained therein consist only of gold, cobalt and tungsten; even in this case, however, other metallic components may be contained in impurity-level amounts.

According to the present invention, it is possible to obtain a gold-cobalt based amorphous alloy plated film having excellent contact resistance and hardness, represented by a contact resistance of not more than 5 mΩ, particularly not more than 4 mΩ, further particularly not more than 3 mΩ, and a Knoop hardness Hk of not less than 200, particularly not less than 210. In addition, the gold-cobalt based amorphous alloy plated film in the present invention is such that, when it is subjected to an annealing treatment not more than 300° C., the homogeneous amorphous phase not having microcrystals would not be changed (namely, would not undergo crystallization with the result of generation of microcrystals), and its contact resistance before the annealing treatment is little changed by the treatment.

The gold-cobalt based amorphous alloy plated film in the present invention has not only excellent contact resistance and chemical stability but also such a high hardness as not to be attainable with the conventional gold or gold alloy plated films. In view of these characteristic features, the gold-cobalt based amorphous alloy plated film in the present invention is effective as conduction contacts of, for example, terminals in electric and electronic component parts such as electromagnetic switches, breakers, thermostats, relays, timers, various switches, printed wiring boards, etc.

EXAMPLES

Now, the present invention will be described in detail below, based on Examples, but the invention is not to be limited to or by the following Examples. The methods and conditions of analysis and measurement employed in Examples are as follows.

XRD

By use of RINT-TTR, produced by Rigaku Corporation; CuKα (50 kV/200 mA)

Metal Composition

By use of JAX-8600, produced by JEOL Ltd.; EDS-EPMA method

Non-Metallic Element Measurement

By use of inorganic composition element analyzer CS-444, TC-436, produced by LECO Corporation Knoop Hardness Measured according to Japanese Industrial Standards (JIS) Z 2251; load: 49.0 mN (HK 0.005); load retention time: five second Contact Resistance By use of electric contact simulator CRS-112-AL, produced by Yamasaki-Seiki Co., Ltd.; four-terminal method; load: 1 N; applied current: 10 mA Wear Resistance Test By use of electric contact simulator CRS-112-AL, produced by Yamasaki-Seiki Co., Ltd. and rotational sliding apparatus; hard gold plated probe is put in contact with plated sample, and rotational sliding is conducted at a speed of 55 rpm under a load of 50 gf; contact resistance between the probe and the sample is measured at intervals of a predetermined number of rotations.

Examples 1 to 3

By use of an electroplating bath containing 0.035 mol/dm$^3$ of KAu(CN)$_2$, 0.076 mol/dm$^3$ of CoSO$_4$..7H$_2$O, 0.182 mol/dm$^3$ of Na$_2$WO$_4$..2H$_2$O, and 0.258 mol/dm$^3$ of citric acid and regulated to pH 6 with aqueous ammonia and sulfuric acid, electroplating was conducted under the conditions of a temperature of 70° C. and a current density of 40 mA/cm$^2$ (Example 1), 10 mA/cm$^2$ (Example 2) or 5 mA/cm$^2$ (Example 3), to form a gold-cobalt based amorphous alloy plated film (thickness: 5 μm) on a 99.96% pure copper plate. A platinum plate was used as an anode, and the plating bath was strongly stirred during plating.

The gold-cobalt based amorphous alloy plated films thus obtained were analyzed by XRD. The XRD patterns are shown in FIG. 1. From the results it is seen that every one of the plated films obtained had an amorphous structure. In addition, the gold-cobalt based amorphous alloy plated films obtained were subjected to composition analysis and to measurement of Knoop hardness and contact resistance. The results are shown in Table 1. Carbon was detected as a non-metallic element. Besides, the plated films each had a hardness higher than the Koop hardness (Hk=about 200) of cobalt hard gold.

TABLE 1

| | Current density (mA/cm$^2$) | Au (wt %) | Co (wt %) | W (wt %) | C (wt %) | Na (wt %) | Hardness (Hk) | Contact resistance (mΩ) |
|---|---|---|---|---|---|---|---|---|
| Example 1 | 40 | 79.3 | 17.5 | 0.08 | 2.7 | 0.5 | 216 | 3.06 |
| Example 2 | 10 | 86.6 | 11.2 | 0.1 | 1.7 | 0.5 | — | 2.23 |
| Example 3 | 5 | 85.2 | 11.9 | 0.2 | 2.3 | 0.5 | 213 | 2.92 |

Further, the plated film in Example 1 was subjected to wear resistance test, upon which it was found that the plated film had a wear resistance comparable to that of cobalt hard gold.

Example 4

Plating was conducted in the same manner as in Example 1, except that the concentration of KAu(CN)$_2$ was 3.5×10$^{-3}$ mol/dm$^3$. For the plated film obtained, XRD analysis and fluorescent X-ray analysis were carried out. The XRD pattern was the same as in Example 1, indicating that the obtained alloy was amorphous. Besides, the results of the fluorescent X-ray analysis showed that the ratio of Au to Co was Au/Co (weight ratio)=0.55.

Example 5

Plating wad conducted in the same manner as in Example 1, except that the concentration of CoSO$_4$..7H$_2$O was 0.155 mol/dm$^3$. For the plated film obtained, XRD analysis and fluorescent X-ray analysis were conducted. The XRD pattern was the same as in Example 1, indicating the amorphousness of the alloy obtained. In addition, it was found from the results of the fluorescent X-ray analysis that the ratio of Au to Co was Au/Co (weight ratio)=1.3.

Example 6

Plating was conducted in the same manner as in Example 1, except that the concentration of Na$_2$WO$_4$..2H$_2$O was 0.364 mol/dm$^3$. For the plated film obtained, XRD analysis and fluorescent X-ray analysis were carried out. The XRD pattern was the same as in Example 1, indicating that the alloy obtained was amorphous. Besides, the results of the fluorescent X-ray analysis showed that the ratio of Au to Co was Au/Co (weight ratio)=1.5.

Examples 7 to 10

By use of an electroplating bath containing 0.035 mol/dm$^3$ of KAu(CN)$_2$, 0.026 mol/dm$^3$ of CoSO$_4$..7H$_2$O, 0.234 mol/dm$^3$ of Na$_2$WO$_4$..2H$_2$O, and 0.260 mol/dm$^3$ of ammonium citrate and regulated to pH 8.5 with sulfuric acid, electroplating was conducted under the conditions of a temperature of 70° C. and a current density of 40 mA/cm$^2$ (Example 7), 20 mA/cm$^2$ (Example 8), 15 mA/cm$^2$ (Example 9) or 12.5 mA/cm$^2$ (Example 10), to form a gold-cobalt based amorphous alloy plated film (thickness: 5 μm) on a 99.96% pure copper plate. A platinum plate was used as an anode, and the plating bath was strongly stirred during plating.

Figure 2:
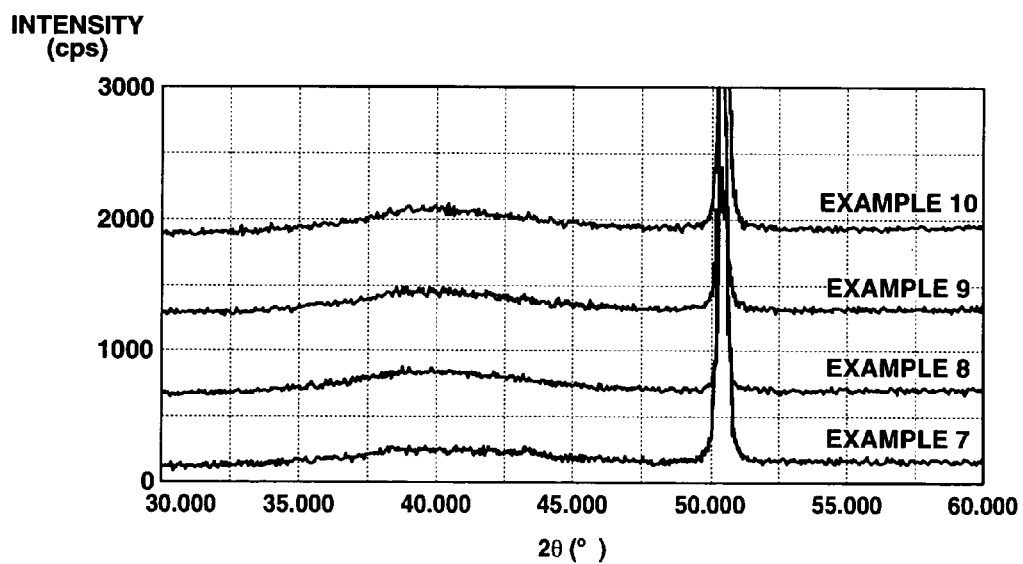
FIG. 2 is a diagram showing the XRD patterns of gold-cobalt based amorphous alloy plated films obtained in Examples 7 to 10.

The gold-cobalt based amorphous alloy plated films thus obtained were analyzed by XRD. The XRD patterns are shown in FIG. 2. From the results it is seen that every one of the plated films obtained had an amorphous structure. In addition, the gold-cobalt based amorphous alloy plated films obtained were subjected to fluorescent X-ray analysis, upon which it was found that the ratios of Au to Co (Au/Co (weight ratio)) were 1.2 (Example 7), 1.4 (Example 8), 1.4 (Example 9) and 1.5 (Example 10), respectively. Furthermore, the Knoop hardness of the plated film in Example 8 was measured, to be Hk=233, higher than the Knoop hardness (Hk=about 200) of cobalt hard gold.

The invention claimed is:

1. A gold-cobalt-carbon based amorphous alloy plated film consisting of a homogeneous amorphous phase not having microcrystals, wherein not less than 1.7 wt % but not more than 4 wt % of carbon is contained.

2. The gold-cobalt-carbon based amorphous alloy plated film of claim 1, wherein said film contains not less than 96 wt % of metallic components including gold and cobalt, and the total content of gold and cobalt in said metallic components is not less than 98 wt % and the gold/cobalt ratio is from 0.5 to 10.0 (weight ratio).

3. The gold-cobalt-carbon based amorphous alloy plated film of claim 2, wherein said film further contains tungsten as said metallic component, and the content of tungsten in said metallic components is not more than 2 wt %.

4. The gold-cobalt-carbon based amorphous alloy plated film of claim 1, wherein a contact resistance of said film is not more than 5 mΩ.

5. The gold-cobalt-carbon based amorphous alloy plated film of claim 1, wherein a Knoop hardness Hk of the film is not less than 200.

* * * * *